(12) United States Patent
Matsuse

(10) Patent No.: US 6,576,062 B2
(45) Date of Patent: Jun. 10, 2003

(54) FILM FORMING APPARATUS AND FILM FORMING METHOD

(75) Inventor: Kimihiro Matsuse, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/752,677

(22) Filed: Jan. 3, 2001

(65) Prior Publication Data

US 2001/0007244 A1 Jul. 12, 2001

(30) Foreign Application Priority Data

Jan. 6, 2000 (JP) .................................... 2000-000590

(51) Int. Cl.[7] ................................................ A01J 27/02
(52) U.S. Cl. .............. 118/719; 156/345.31; 156/345.34
(58) Field of Search .................. 118/715, 719, 118/728, 729, 730; 414/935; 156/345.31, 345.34

(56) References Cited

U.S. PATENT DOCUMENTS

| | | | | |
|---|---|---|---|---|
| 4,058,430 A | * | 11/1977 | Suntola et al. | 156/611 |
| 4,699,805 A | * | 10/1987 | Seelbach et al. | 437/245 |
| 4,976,996 A | * | 12/1990 | Monkowski et al. | 427/255.5 |
| 5,166,092 A | | 11/1992 | Mochizuki et al. | |
| 5,281,274 A | * | 1/1994 | Yoder | 118/697 |
| 5,338,362 A | * | 8/1994 | Imahashi | 118/719 |
| 5,366,555 A | * | 11/1994 | Kelly | 118/719 |
| 5,647,945 A | * | 7/1997 | Matsuse et al. | 156/345 |
| 5,747,113 A | * | 5/1998 | Tsai | 427/255 |
| 5,807,792 A | * | 9/1998 | Ilg et al. | 438/758 |
| 5,834,730 A | * | 11/1998 | Suzuki et al. | 219/121.43 |
| 5,879,459 A | | 3/1999 | Gadgil et al. | |
| 5,951,770 A | * | 9/1999 | Perlov et al. | 118/719 |
| 6,020,024 A | | 2/2000 | Maiti et al. | |
| 6,042,652 A | | 3/2000 | Hyun et al. | |
| 6,299,683 B1 | * | 10/2001 | Rupp et al. | 117/88 |
| 6,319,553 B1 | * | 11/2001 | McInerney et al. | 427/250 |
| 6,395,640 B2 | * | 5/2002 | Rose | 438/706 |

FOREIGN PATENT DOCUMENTS

| | | | | |
|---|---|---|---|---|
| JP | 2-246161 | 10/1990 | | |
| JP | 3-234025 | 10/1991 | | |
| JP | 4-236465 | 8/1992 | | |
| JP | 5-206036 | 8/1993 | | |
| JP | 7-086172 | 3/1995 | | |
| JP | 63266072 | * | 11/1998 | C23C/16/48 |
| WO | WO 90/10092 | * | 9/1990 | C23C/16/00 |

OTHER PUBLICATIONS

Mikko Ritala, et al., "Atomic Layer Epitaxy Growth of TiN Thin Films from $TiI_4$ and $NH_3$," J. Electrochem. Soc., vol. 145, No. 8, Aug. 1998, pp. 2914–2919.

* cited by examiner

Primary Examiner—Benjamin L. Utech
Assistant Examiner—Kapla Moore
(74) Attorney, Agent, or Firm—Oblon, Spivak, McClelland, Maier & Neustadt, P.C.

(57) ABSTRACT

A film forming apparatus and method of the present invention include a substrate holding section for holding a plurality of substrates in a plane within a chamber, first and second process gas discharge sections provided opposite to the substrate holding section to discharge first and second process gases, a rotation mechanism for rotating the substrate holder, and a heater for heating the substrates. While the substrates are rotating as the substrate holding section rotates, the substrate holding section, first and second mono atomic layers are alternately stacked on the corresponding substrates. A compound film is therefore formed through a reaction involved under heating.

17 Claims, 4 Drawing Sheets

FILM FORMING APPARATUS AND FILM FORMING METHOD

CROSS-REFERENCE TO RELATED APPLICATIONS

This application is based upon and claims the benefit of priority from the prior Japanese Patent Application No. 2000-000590, filed Jan. 6, 2000, the entire contents of which are incorporated herein by reference.

BACKGROUND OF THE INVENTION

The present invention relates to a film forming apparatus and method for forming a TiN film, etc., by a CVD (Chemical Vapor Deposition) process using an ALD (Atomic Layer Deposition) method.

In a semiconductor device that should be miniaturized, use is made of a thin film of a metallic compound, such as tungsten silicide (Wsi), titanium nitride (TiN) or titanium silicide (TiSi), as a material for a connection line and barrier layer formed on a semiconductor wafer (hereinbelow referred to as a wafer) that is an object to be processed. The thin film of such metallic compounds is used as a buried layer formed as an interconnect line or a contact hole for interconnection between lines or in a groove, etc.

Conventionally, such a metal compound thin film has been formed by a physical vapor deposition (PVD) method such as the sputtering. With a recent trend toward a higher density integration and a resultant thinner and thinner interconnect line or film, as well as with recent stricter design rules in particular, however, the PVD method provides no adequate countermeasure because a film formed is poor in "burying" property. For this reason, the CVD method has still been used by which a better "burying" property and better film formation can be expected. However, the use of the CVD method provides no adequate countermeasure for film quality required, step coverage and intimate adhesion of a film. For example, Jpn. Pat. Appln. KOKAI Publication No. 55-130896 discloses the technique of forming a metallic compound thin film having a better quality and optimal adhesion and step coverage and an attention has been paid to the ALD method.

In order to deposit the metallic compound thin film, the CVD method using the ALD technique may be utilized. Stated in more detail, upon the formation of a TiN film for example, one wafer is loaded into a chamber, $TiCl_4$ gas is supplied into the chamber, depositing a mono atomic layer of Ti layer. Then $NH_3$ gas is supplied into the chamber, depositing a mono atomic layer as a nitride (N) layer doing so, these are reacted together in a heating atmosphere. By repeating such operation a predetermined number of times a TiN film of a predetermined thickness is obtained.

Upon the formation of a metallic compound thin film using the ALD technique, the switching of these supplying gases needs to be made at high speeds. A high-speed switching valve is used for this purpose. The high-speed switching valve has, however, a short service life.

Further, upon the formation of a plurality of mono atomic layers, a process gas for forming a first film is supplied and then a purge gas is supplied before the supplying of a process gas for forming the second layer. By doing so, the earlier supply gas needs to be completely exhausted from the chamber with the purge gas, thus taking a longer time in the formation of an intended film and hence lowering the productivity involved.

BRIEF SUMMARY OF THE INVENTION

It is accordingly the object of the present invention to provide a film forming apparatus and method which can form films in high productivity with the use of an ALD method and can do so without using any high speed switching valve.

The present invention provides a film forming apparatus comprising: a chamber for holding substrates; a substrate holding section for holding these substrates within the chamber; first process gas discharge sections provided within the chamber and discharging a first process gas; second process gas discharge sections provided at those positions different from those of the first process gas discharge sections and discharging a second process gas; a rotation mechanism for rotating the substrate holding section and a heating section for heating the substrates. While the substrates are rotating as the substrate holding section rotates, films are formed on the substrates by alternately forming a mono atomic layer by the first process gas and a mono atomic layer by the second process gas over the substrates.

Further, the present invention provides a CVD film forming method for discharging first and second process gases from the first and second process gas discharge sections provided at mutually different positions onto corresponding substrates revolved within a chamber and forming films on the substrates by alternately forming a mono atomic layer by the first process gas and a mono atomic layer by the second process gas over the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of the present invention will be explained below, with reference to the accompanying drawings.

Figure 1:
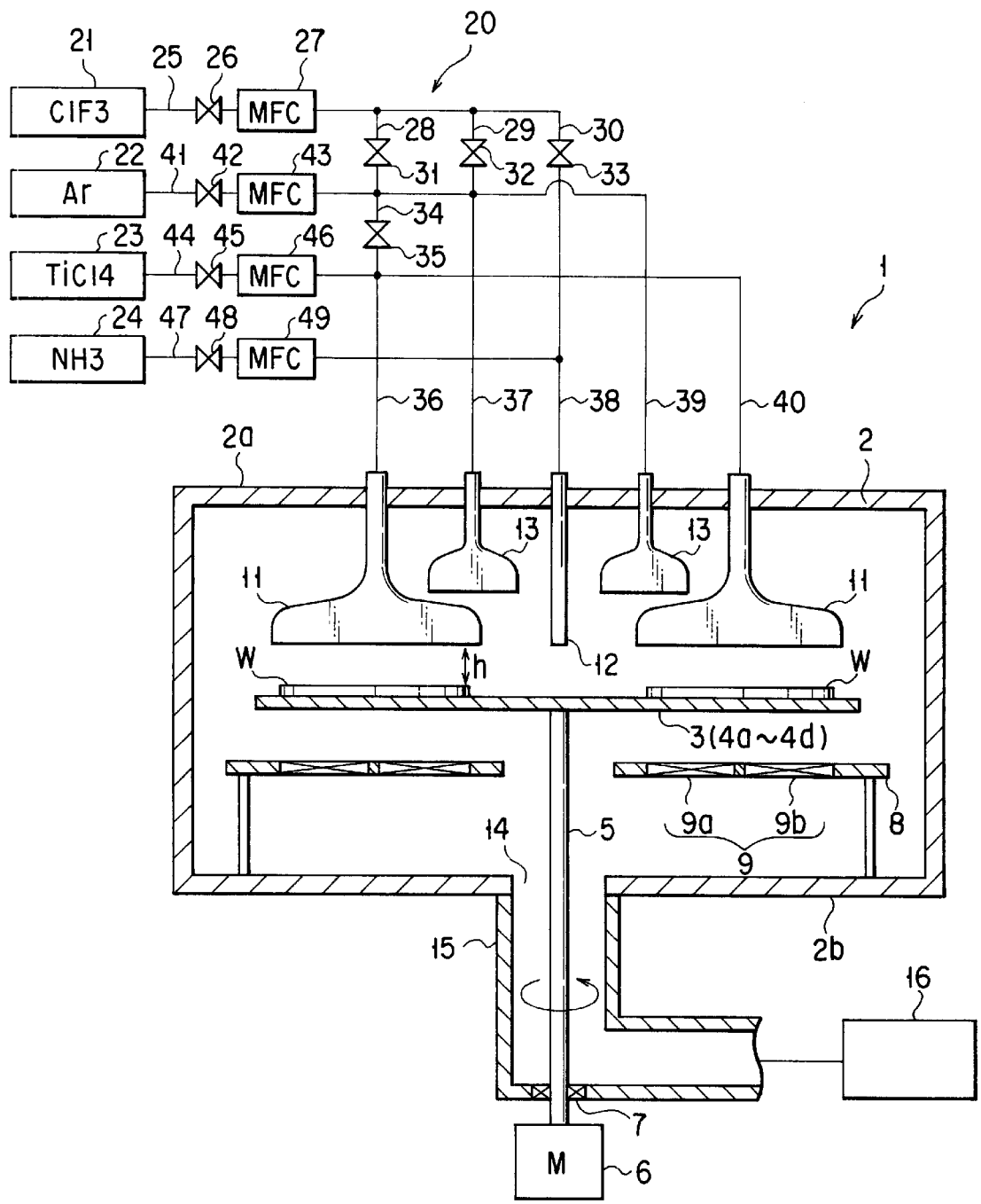
FIG. 1 is a cross-sectional view showing a structure of a film forming apparatus, using an ALD method, according to a first embodiment of the present invention.
Figure 2:
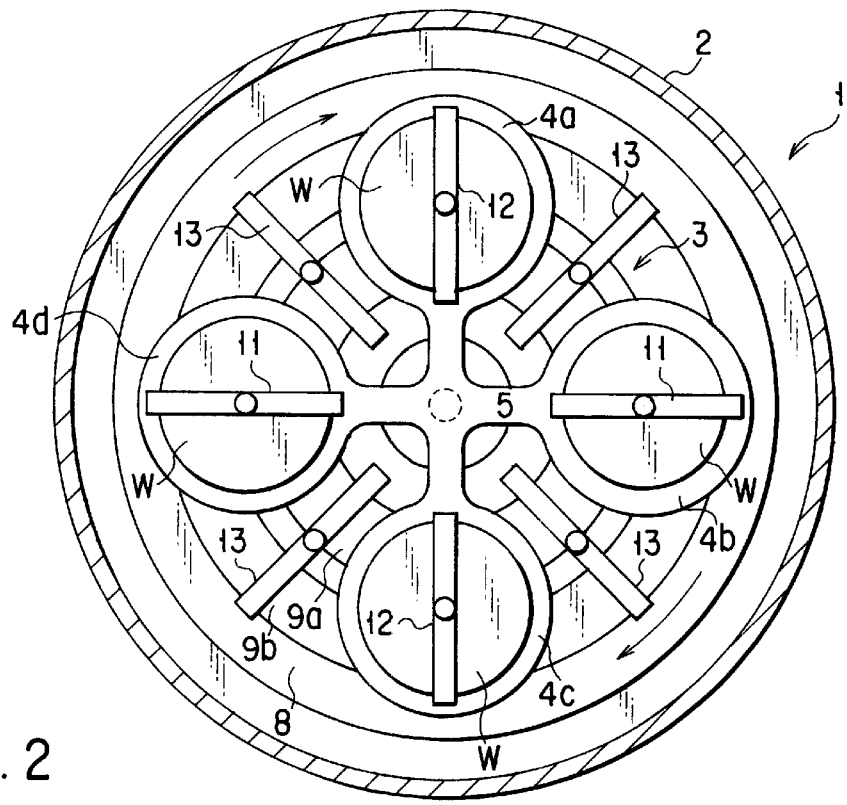
FIG. 2 is a plan view showing an inner structure as seen in a direction toward a wafer holder from a top wall side of the film forming apparatus shown in FIG. 1.

FIG. 1 is a cross-sectional view showing a film forming apparatus, using an ALD method, according to a first embodiment of the present invention. FIG. 2 is a plan view showing an inner structure as seen in a direction toward a wafer holder from a top wall side of the apparatus. In the present embodiment, it will be described how a TiN film is formed by the CVD apparatus using an ALD technique.

This CVD film forming apparatus 1 has a chamber 2, in which a vacuum can be maintained. In the chamber, a wafer holding section (wafer holder) 3 is provided to allow four wafers W as to-be-processed objects to be horizontally held on it. Although, in this embodiment, the chamber 2 and wafer holder 3 are explained below as being substantially cylindrical and disk-like, respectively, the present invention is not restricted thereto.

The wafer holder 3 has four holders 4a to 4d, as shown in FIG. 2, each with a wafer W held on it. The center of the wafer holder 3 is coupled to a downwardly extending rotation shaft 5 which in turn is coupled to a shaft of a motor 6 through a fluid sealing section 7 for maintaining a hermetically air-tight state.

By the rotation of the motor 6, the wafer holder 3 is rotated in the direction of the arrow shown in FIG. 2. Thus, the wafers W held on the holders 4a to 4d revolve about the rotation shaft 5 with the rotation of the wafer holder 3.

A heater support section 8 is provided below the wafer holder 3. A heater 9 (inside heater 9a, outside heater 9b) is ring-like, extending along a moving locus of the wafer W and supported on the heater support section 8.

Process gas discharge nozzles (first process gas discharge sections) 11 and second process gas discharge nozzles (second process gas discharge sections) 12 are provided on the top wall 2a of the chamber 2, having their gas discharge outlets set opposite to the upper surface of the wafer holder 3.

The first process gas discharge nozzles 11, as well as the second process gas discharge nozzles 12, are provided in pairs as shown in FIG. 2. These first and second process gas discharge nozzles 11 and 12 are alternately arranged at intervals of 90° around the center of the rotation shaft 5 along a circumference corresponding to the moving locus of the wafer W. Four purge gas discharge nozzles (purge gas discharge sections) 13 are arranged on the top wall 2a of the chamber 2, with each one set at an intermediate position (45° position) between the first process gas discharge nozzle 11 and the second process gas discharge nozzle 12.

The gas discharge outlets of the purge gas discharge nozzles 13 are arranged at upper positions than those of the first and second process gas discharge nozzles 11 and 12. And predetermined gases are supplied to these nozzles 11, 12 and 13 by a later-described gas supply mechanism 20 into the chamber.

An exhaust hole 14 is provided at a center position in a bottom wall 2b of the chamber 2 and connected to an exhaust pipe 15. An exhaustion system 16 is connected to the exhaust pipe 15, and, by the operation of the exhaust system 16, can reduce the interior of the chamber 2 to a predetermined vacuum level.

It is to be noted that the exhaust pipe 15 extends vertically downwardly from the exhaustion hole 14 to a position where it then extends in a horizontal direction. The rotation shaft 5 extends in the vertically downward portion of the exhaust pipe 15 and then extends through the horizontal section of the exhaust pipe, that is, through the fluid sealing section 7, and is connected to the shaft of the motor 6.

Figure 3A:
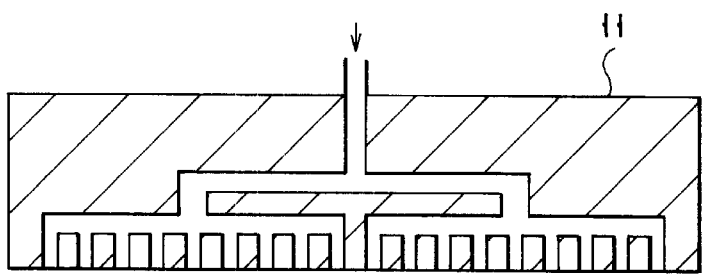
FIGS. 3A and 3B are views each showing a practical form of shower head of the film forming apparatus shown in FIG. 1.
Figure 3B:
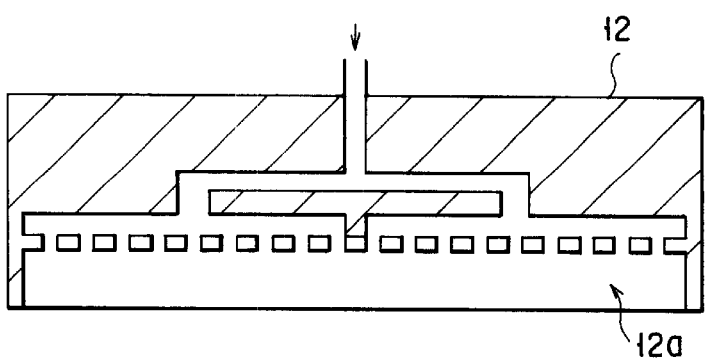

FIG. 3A shows a cross-sectional configuration of the first process gas discharge nozzle 11 and second process gas discharge nozzle 12 and FIG. 3B shows a cross-sectional configuration of the purge gas discharge nozzle 13.

The first process gas discharge nozzle 11 and second process gas discharge nozzle 12 each divide the corresponding process gas into a plurality of branched portions and discharge them as a fluid shower into the chamber.

Further, the purge gas discharge nozzle 13 is designed to discharge the purge gas in the form of a shower. The nozzle 13 has a skirt section 12a provided at a forward end portion to suppress the spread of the gas and hence to provide a down flow in an air curtain.

The distance h between the discharge outlets of the first and second process gas discharge nozzles 11 and 12 on one hand and the surface of the wafers W, on the other hand, held by the holders 4a, . . . , 4d is in a range of 0.1 to 10 mm, preferably in a range of 0.1 to 5 mm. The distance h between the discharge outlet of the purge gas discharge nozzle 13 and the surface of the wafers W held by the corresponding holders is in a range of 0.2 to 50 mm and, preferably, 0.2 to 10 mm. The distance between the holders 4a, . . . , 4d and the discharge outlets of the purge gas discharge nozzles 13 is in a range of 1.1 to 50 mm and preferably in a range of 1.2 to 11 mm. In particular, the discharge outlets of the purge gas discharge nozzle 12 are located in an upper position (but in a position away from the wafer W) than the discharge outlets of the first and second process gas discharge nozzles 11 and 12 in which case a discharge Ar gas must serve as an air curtain.

The gas supply mechanism 20 has a $ClF_3$ supply source 21 for supplying a $ClF_3$ gas serving as a cleaning gas, an Ar supply source 22 for supplying an Ar gas, a $TiCl_4$ supply source 23 for supplying a $TiCl_4$ gas and an $NH_3$ supply source 24 for supplying an $NH_3$ gas.

The $ClF_3$ supply source 21 is connected by a gas line 25 and valve 26 to a mass flow controller (MFC) 27 and further by gas lines 28, 29 and 30 and valves 31 and 35, 32, and 33 and gas lines 36, 37, 38, 39 and 40 to the gas discharge nozzles 11, 12 and 13. At the time of cleaning, the $ClF_3$ gas is supplied into the chamber. The Ar supply source 22 is connected by a gas line 41 and valve 42 to an MFC 43 and further by the valve 35 and gas lines 36, 37 and 40 to the gas discharge nozzles 11 and 12 to supply the Ar gas to the gas discharge nozzles 11 and 12.

Further, the $TiCl_4$ supply source 23 is connected by a gas line 44 and valve 45 to an MFC 46 and further by gas lines 36 and 40 to the gas discharge nozzles 11, to supply the $TiCl_4$ gas into the chamber. The $NH_3$ supply source 42 is connected by a gas line 47 and valve 48 to an MFC 49 and, further by a gas line 38 to the gas discharge nozzle 12 to supply the $NH_3$ gas to be supplied into the chamber.

The first process gas contains any one of elements Ti, Ta, Si, W and Ru. It may be, for example, $TiCl_4$, $TaBr_5$, $Ta(OC_2H_5)_5$, $SiCl_4$, $SiH_4$, $Si_2H_6$, $SiH_2Cl_2$, $WF_6$ or the like. The second process gas contains N or O. It may be, for example, $NH_3$, $NH_3(N_2)$, $O_2$, $O_3$, NO, $N_2O_3$, $N_2O_2$ or the like.

In the CVD film forming apparatus thus constructed, first, semiconductor wafers W are inserted into the chamber 2 and sequentially set on the holders 4a to 4d of the wafer holder 3 within the chamber. Then the wafer holder is rotated while heating the wafers W.

Then, the interior of the chamber 2 is exhausted by the exhaustion system 16 to a predetermined vacuum level. The $TiCl_4$ gas carried by the Ar gas, $NH_3$ gas and Ar gas (purge gas) are supplied from the first process gas discharge nozzle 11, second process gas discharge nozzle 12 and purge gas discharge nozzle 13, respectively.

The wafers W held at the holders 4b, 4d of the holders 4a to 4d are first supplied with the $TiCl_4$ gas from the first process gas discharge nozzles 11 to deposit a titanium layer as a mono atomic layer on the surfaces of the wafers involved. Then the wafer holder 3 is rotated to allow the wafer W to be brought, past an Ar gas curtain discharged from the purge gas nozzle 13, just beneath the second process gas discharge nozzle 12 where an $NH_3$ gas is discharged to allow a nitride layer to be deposited as a mono atomic layer on the Ti layer, so that a TiN film is formed through a reaction of these.

Then the film-deposited semiconductor wafer is moved past an Ar gas curtain. In the same way as set out above, a titanium layer and nitride layer are stacked a predetermined number of times to provide a TiN film of a predetermined thickness.

On the wafers W held by the holders 4a, 4c and supplied with the $NH_3$ gas from the second process gas discharge nozzles 12, a nitride layer is formed as a mono atomic layer with the use of the $NH_3$ gas thus supplied. As the wafer holder 3 rotates, the wafer W is brought, past an Ar gas curtain discharged from the purge gas nozzle 13, to a position where a $TiCl_4$ gas is supplied via the first process gas discharge nozzle 11 onto the wafer W to deposit a titanium layer as a mono atomic layer on the nitride layer. A TiN film is therefore formed through a reaction of these materials.

Further the film-formed wafer W is moved past the Ar gas curtain discharged via the purge gas nozzle 13. In the same way as set out above, the nitride layer and titanium layer are deposited alternately over the resultant wafer W to sequentially form a stacked layer structure and hence to form a TiN film of a predetermined thickness. In this case, the rotation speed of the wafer holder 3 is determined in accordance with the adsorption speed of the $TiCl_4$ gas and $NH_3$ gas (process gases). The heating temperature of the heater 9 is set to a proper temperature suitable to the reaction of Ti and N.

In this way, the $TiCl_4$ gas and $NH_3$ gas, being supplied via the alternately arranged first and second process gas discharge nozzles 12 into the chamber, are alternately supplied onto the wafer W surface as the wafer holder 3 rotates. This performs the same function as in the case of using a high-speed switching valve. By the ALD method, the mono atomic layer of Ti and mono atomic layer of N are alternately formed over the wafers to provide a desired TiN film.

Further, a plurality of wafers W are set on the wafer holder 3 at a time. In one process, a film is formed on these wafers W, thus ensuring high productivity compared with the case where the single wafer processing system.

Further, the Ar gas is discharged as purge gas from the purge gas nozzle 13 to provide a gas curtain. The blending of the $TiCl_4$ gas and $NH_3$ gas in the chamber can thereby be reduced to a minimum possible, so that any unwanted product is suppressed from being deposited in the chamber. By blowing the Ar gas as purge gas onto the wafer surface, the process gas can be quickly removed from that surface of the wafer W on which the mono atomic layer has been formed. It is possible to form a film of better quality without any excessive reaction being progressed.

In this way, the TiN film is repeatedly formed. When an intended film is formed by a film forming process on a plurality of wafers W at a time, a $ClF_3$ gas is supplied from the $ClF_3$ supply source 21 through the gas line 25, valve 26 and MFC 27, gas lines 28, 29 and 30, and valves 31 and 35, 32 and 33, gas lines 36, 37, 38, 39 and 40 and gas discharge nozzles 11, 12 and 13 into the chamber 2. A cleaning operation is thereby performed.

An example of process conditions in this CVD film forming apparatus will be described below.

(1) Process Conditions for Forming a TiN Film

Flow rate of a $TiCl_4$ gas: 1 to 500 sccm (preferably 5 to 20 sccm)

Flow rate of an $NH_3$ gas: 50 to 1000 sccm (preferably 50 to 500 sccm)

Flow rate of an Ar gas: 10 to 100 sccm (carrier gas: omissible if being small in flow amount)

Intra-chamber pressure: 100 mtorrs to 5 torrs (preferably 100 mtorrs to 1 torr)

Film forming temperature: 300 to 700° C. (preferably 400 to 600° C.)

(2) Condition for a $ClF_3$ Cleaning

Flow rate of a $ClF_3$ gas: 100 to 500 sccm (preferably, 200 to 300 sccm)

Intra-chamber process: 1 torr to 10 torrs (preferably 1 torr to 5 torrs)

Process temperature: 200 to 500° C. (preferably, 200 to 300° C.)

(3) Purge gas Curtain Condition

Flow rate of a purge gas: 100 to 1000 sccm

Figure 4:
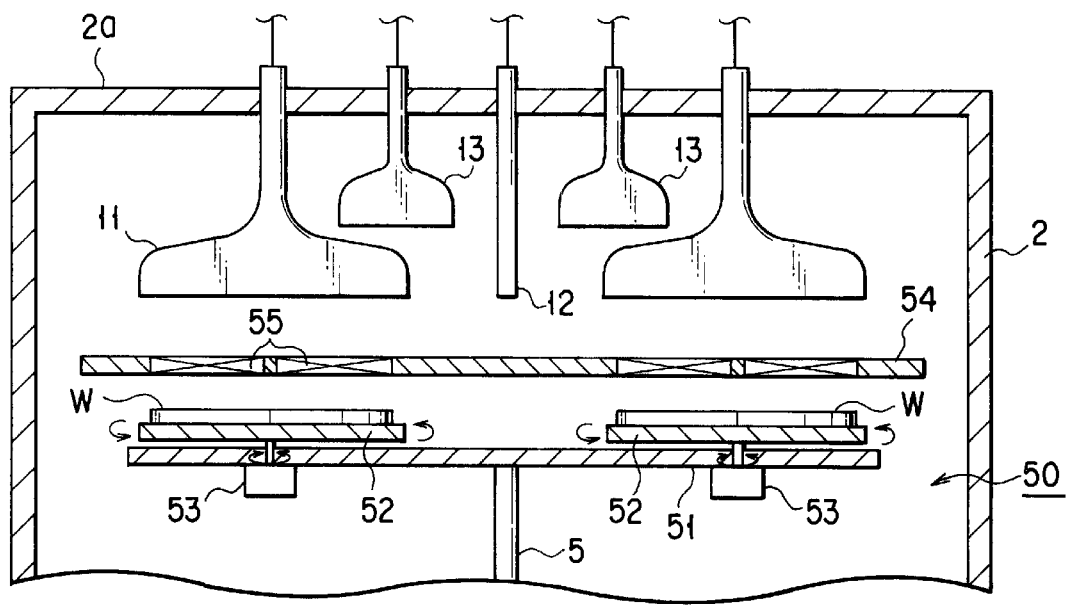
FIG. 4 is a cross-sectional view showing a major section of a film forming apparatus of a second embodiment using the ALD method.

FIG. 4 is a cross-sectional view showing a part of CVD film forming apparatus according to a second embodiment. Here, a wafer holder 50 is used in place of the wafer holder 3 to rotate wafers W. The wafer holder 50 comprises, for example, four (only two are shown) holders 52. The holders 52 are arranged over a base section 51 and can rotate. By rotating these wafer holders 52 by a motor 53, the wafer W on the holder 52 is rotated. By doing so, $TiCl_4$ gas and $NH_3$ gas can be supplied as process gases onto the wafers W more uniformly.

A heater 8 may be set below the wafer holder as shown in FIG. 1. In this case, the heating efficiency is lowered. In this embodiment, it is preferable that a heater support section 54 for support a heater 55 be provided above the wafer W.

In the case where the heater 55 is provided in this way, many gas-passable holes are preferably provided in the heater 55 and heater holding member 54 to supply the process gas effectively onto the wafer W.

Figure 5:
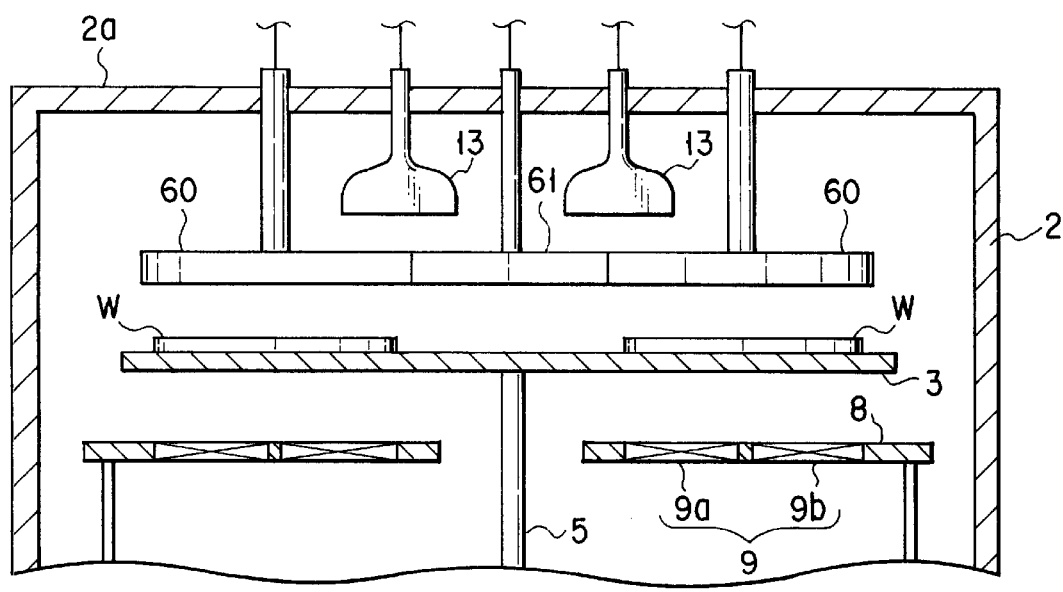
FIG. 5 is a cross-sectional view showing a major section of a film forming apparatus of a third embodiment using the ALD method.

FIG. 5 is a cross-sectional view showing a part of a CVD film forming apparatus according to a third embodiment. In this embodiment, $TiCl_4$ gas and $NH_3$ gas used as process gases are supplied via shower heads 60 and 61 onto wafers W.

Figure 6:
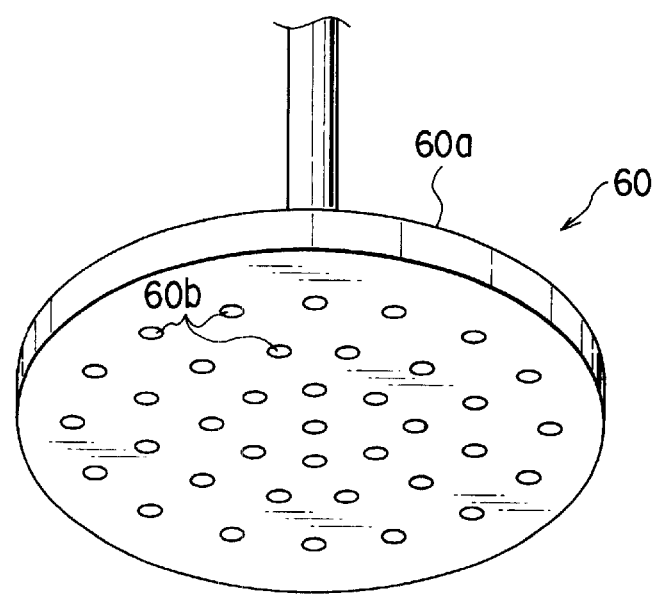
FIG. 6 is a cross-sectional view showing an outer structure of a shower head used in the third embodiment.

The shower head 60 has a disk-like hollow body 60a. The body 60a has many gas discharge holes 60b in its lower surface as shown in FIG. 6. Through the holes 60b, gas is uniformly discharged into a chamber. The shower head 61 is also formed as described above in connection with the shower head 60. By using the shower head in place of the nozzles it is possible to supply a $TiCl_4$ gas and $NH_3$ gas uniformly onto the wafer W.

Figure 7:
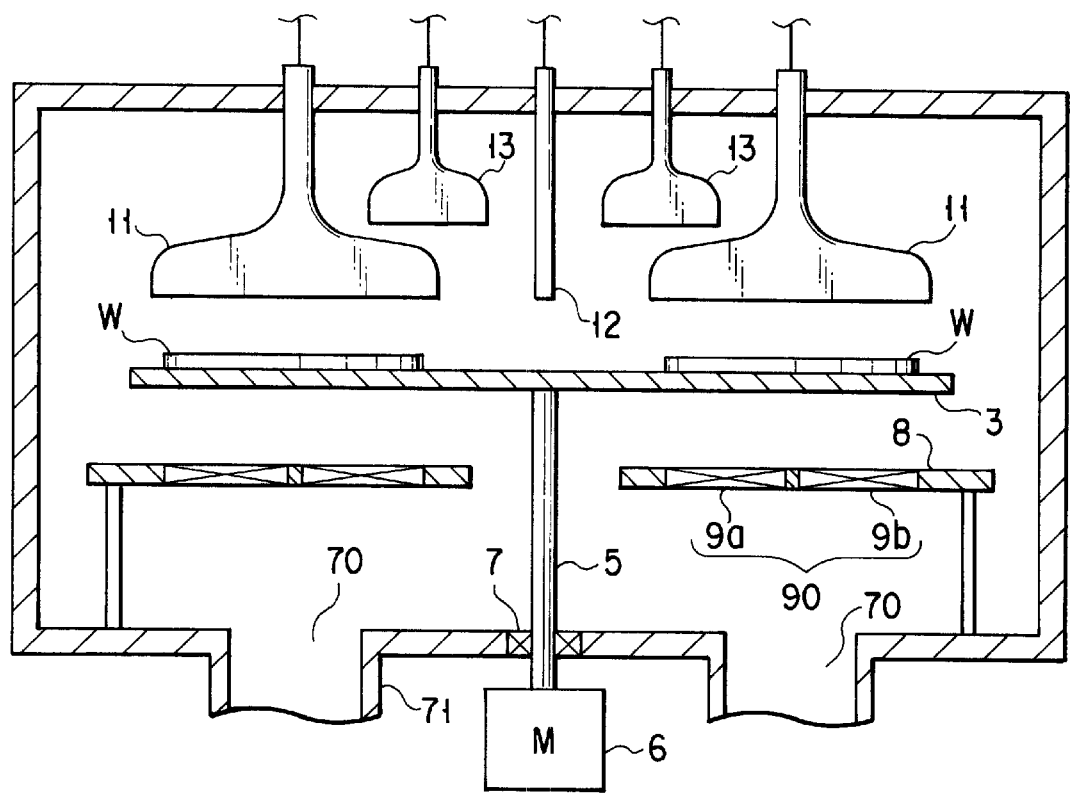
FIG. 7 is a cross-sectional view showing an major section of a film forming apparatus of a fourth embodiment using the ALD method.

FIG. 7 is a cross-sectional view showing a part of a CVD film forming apparatus according to a fourth embodiment. In this embodiment, exhaust holes 70 are provided beneath first and second process gas discharge nozzles 11 and 12. In FIG. 7, only the exhaust hole corresponding to the first processing gas discharge nozzle 11 is shown.

By this structure it is possible to quickly discharge unrequired TiCl$_4$ gas and NH$_3$ gas through exhaust pipe 71 attached to the exhaustion holes 70.

The present invention is not limited to the above-mentioned embodiments. Various changes and modifications can be made without departing from the scope of the invention. Although forming a TiN film formed in the above-mentioned embodiment, it is possible to form a film of TaN, SiO$_2$, SiN, SiON, SiOF, WN, Wsi, RuO$_2$ or the like.

The heater has been explained as located below the wafer in the example of FIG. 1 and above the wafer in the example of FIG. 4 alternatively, it may be provided both below and above the wafer and in any other proper position so long as uniform heating is possible.

Although the Ar gas is used as a purge gas, other proper gases such as an N$_2$ gas may be used. Further, if the two kinds of process gases as set out above can be effectively shut off, it is not necessary to use any purge gas. Further, as a substrate, not only the semiconductor wafer but also other objects may be used and it may be possible to use a substrate having another layer formed on its surface.

According to the present invention, as set out above, the following advantages can be obtained:

1. Upon the formation of CVD films by the use of the ALD method, the wafers, while being supplied with the first and second process gases from the alternately arranged first and second process gas discharge sections, are moved past these alternately arranged sections. This operation is the same as in the case of using a high-speed switching valve. By doing so, a mono atomic layer is alternately deposited onto the wafers by the first and second process gases to form a film on the surface of the wafers through a reaction involved. By doing so it is also possible to form a metallic compound film on the wafers.

2. In the CVD film forming apparatus, the first and second process gas discharge sections are alternately arranged in a circumferential manner. It is, therefore, possible to process a plurality of substrates at a time and to form an intended film on the substrates in high productivity.

3. Since an air curtain is formed by the purge gas between the first process gas discharge section and the second process gas discharge section, a plurality of process gases can be introduced within the same chamber to deposit different films over the wafers. Further, the process gases are exhausted in not-crossed directions and it is possible, therefore, to suppress the depositing of any unwanted product.

4. In order to move the wafers across the process gas introducing zones within the chamber, use is made of the rotation mechanism with the wafers held thereon. By doing so, it is possible to easily move the wafers past those positions just below the process gas discharge sections and to positively form a mono atomic layer over the wafers.

5. Since the "rotating" wafers themselves are "revolved", it is possible to enhance the uniformity with which films are formed.

A purge gas discharge section is provided between the first process gas discharge section and the second process gas discharge section. The purge gas discharge section applies a stream of gas that works as an air curtain.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming apparatus comprising:
   a chamber for holding substrates;
   a substrate holding section for holding these substrates in the chamber;
   a plurality of first process gas discharge sections provided in those positions facing film forming surfaces of the substrates within the chamber, for discharging a first process gas;
   a plurality of second process gas discharge sections provided in those positions different from those of the first process gas discharge sections within the chamber, for discharging a second process gas;
   a plurality of purge gas discharging sections that discharge a purge gas to a position different from that of the first and second process gas discharge sections in the chamber;
   a rotation mechanism for rotating the substrate holding section; and
   a heating section for heating the substrate,
   wherein the purge gas discharge sections are provided above the first and second process gas discharge sections, and
   wherein a shape of the outlet of the purge gas discharge section is a shower head identically to that of the outlet of the process gas discharge section.

2. The apparatus according to claim 1, wherein the first and second process gas discharge sections and the purge gas discharge sections are alternately arranged so that the centers of the respective discharge outlets are aligned in the orbit of the center of the substrate about which the substrates revolve.

3. The apparatus according to claim 1, wherein a purge gas discharge provided between the first process gas discharge section and the second process gas discharge section, and functions as an air curtain.

4. The apparatus according to claim 1, wherein the film forming apparatus further has a substrate rotation mechanism that rotates the substrate while being held.

5. The apparatus according to claim 1, wherein the heating means is provided in a position where the substrate is heated from either or both above or/and below the substrate holding member.

6. The apparatus according to claim 1, wherein the outlet of the purge gas discharge section is a shower head.

7. The apparatus according to claim 1, wherein the purge gas discharge section is provided between the process gas discharge sections.

8. The apparatus according to claim 1, wherein a distance between the process gas discharge section and the surface of the substrate is 0.1–10 mm.

9. The apparatus according to claim 1, wherein a distance between the purge gas discharge section and a surface of a substrate is 0.2–50 mm.

10. The apparatus according to claim 1, wherein the purge gas discharge section and the process gas discharge section are alternately arranged so that centers of the respective outlets of the purge and discharge section and process gas discharge section are aligned in an orbit of a center of the substrate about which the substrate revolves.

11. A film forming apparatus comprising:
    a chamber configured to hold a plurality of substrates;
    a substrate holding section configured to hold the plurality of substrates in the chamber;
    a plurality of first process gas discharge sections provided in those positions facing surfaces of the substrates within the chamber, which discharges a process gas to the respective surfaces of the substrates;

a plurality of purge gas discharge sections provided in those positions different from those of the process gas discharge sections within the chamber, which discharges a purge gas into the chamber;

a driving section configured to revolve the substrates by rotating the substrate holding section; and a heating section configured to heat the substrates, wherein the purge gas discharge sections are provided above the process gas discharge sections, and wherein the purge gas discharge section is shaped like a shower head identically to the outlet of the process gas discharge section.

12. The apparatus according to claim 11, wherein the purge gas discharge section is provided between the process gas discharge sections.

13. The apparatus according to claim 11, wherein a shape of the purge gas discharge section is a nozzle shape having a length equal to a diameter of the substrate.

14. The apparatus according to claim 11, wherein an end of the purge gas discharge section is skirt shaped.

15. The apparatus according to claim 11, wherein a distance between the process gas discharge section and the surface of the substrate is 0.1–10 mm.

16. The apparatus according to claim 11, wherein a distance between the purge gas discharge section and the surface of the substrate is 0.2–50 mm.

17. The apparatus according to claim 11, wherein the purge gas discharge section and the process gas discharge section are alternately arranged so that centers of the respective outlets of the purge and discharge section and process gas discharge section are aligned in an orbit of a center of the substrate about which the substrate revolves.

* * * * *